(12) United States Patent
Tayloe

(10) Patent No.: US 6,230,000 B1
(45) Date of Patent: May 8, 2001

(54) PRODUCT DETECTOR AND METHOD THEREFOR

(75) Inventor: Daniel Richard Tayloe, Phoenix, AZ (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/173,030

(22) Filed: Oct. 15, 1998

(51) Int. Cl.[7] .................................. H04B 1/26; H04B 1/00
(52) U.S. Cl. .......................... 455/323; 455/303; 455/304; 455/313
(58) Field of Search ..................... 455/302, 303, 455/304, 324, 338, 339, 313, 318, 323; 375/323, 329, 332; 327/113, 45; 329/304

(56) References Cited

U.S. PATENT DOCUMENTS

| | | | |
|---|---|---|---|
| 4,847,860 | * 7/1989 | Robert ................................ | 375/136 |
| 4,878,029 | 10/1989 | Saulnier et al. ..................... | 329/341 |
| 5,150,124 | 9/1992 | Moore et al. ........................ | 342/68 |
| 5,339,459 | 8/1994 | Schiltz et al. ....................... | 455/333 |
| 5,355,103 | * 10/1994 | Kozak .................................. | 455/289 |
| 5,557,642 | 9/1996 | Williams ............................. | 375/316 |
| 5,761,615 | * 6/1998 | Jaffee .................................. | 455/314 |
| 5,805,093 | 9/1998 | Heikkila et al. . | |
| 5,838,675 | * 11/1998 | Rauscher ............................. | 370/343 |
| 5,999,574 | * 12/1999 | Sun et al. ............................ | 375/326 |
| 6,073,001 | * 6/2000 | Sokoler ............................... | 455/323 |
| 6,088,581 | * 7/2000 | Bickley et al. ...................... | 455/131 |

FOREIGN PATENT DOCUMENTS

| | | | |
|---|---|---|---|
| 0691733 | 6/1995 | (EP) | ............................ H03B/21/00 |
| 2294169 | 9/1995 | (GB) | .............................. H03D/7/00 |
| 9110283 | 12/1990 | (WO) | .............................. H03D/3/00 |
| 9602977 | 7/1995 | (WO) | .............................. H04B/1/26 |
| 9838732 | 2/1998 | (WO) | .............................. H03D/7/00 |

OTHER PUBLICATIONS

Article entitled "A 1.5 GHz Highly Linear CMOS Down-conversion Mixer" published in IEEE Journal of Solid–State Circuits, vol. 30, No. 7, Jul. 1995.
Article entitled "Recent Advances in Shortwave Receiver Design" by Dr. Ulrich L. Rohde in QST, Nov. 1992.
Article "Asymmetric Polyphase Networks" by M.J. Gingell in Electrical Communication, vol. 48, No. 1 and 2, 1973.
Aritcle entitled "High–Performance, Single–Signal Direct–Conversion Receivers" by Rick Campbell —QST Magazine (Jan. 1993).

\* cited by examiner

*Primary Examiner*—Dwayne Bost
*Assistant Examiner*—Raymond B. Persino
(74) *Attorney, Agent, or Firm*—Dana B. LeMoine; Timothy J. Lorenz; Frank J. Bogacz

(57) ABSTRACT

A product detector for converting a signal to baseband includes a commutating switch which serves to sample an RF waveform four times per period at the RF frequency. The samples are integrated over time to produce an average voltage at 0 degrees, 90 degrees, 180 degrees and 270 degrees. The average voltage at 0 degrees is the baseband in-phase signal, and the average voltage at 90 degrees is the baseband quadrature signal. Alternatively, to increase gain, the 0 degree average can be differentially summed with the 180 degree average to form the baseband in-phase signal, and the 90 degree average can be differentially summed with the 270 degree average to produce the baseband quadrature signal.

14 Claims, 3 Drawing Sheets

PRODUCT DETECTOR AND METHOD THEREFOR

FIELD OF THE INVENTION

This invention relates in general to radio receivers and, in particular, to the converting of signals in frequency.

BACKGROUND OF THE INVENTION

Direct conversion receivers are desirable in part because they convert signals of interest directly to baseband (or near zero hertz) from a radio frequency (RF) or an intermediate frequency (IF). Simple direct conversion receivers, such as receiver 10 shown in FIG. 1, suffer from multiple drawbacks. The RF signal $f_1$ is mixed with the local oscillator signal $f_0$, and the signal of interest $f_1-f_0$ is produced at baseband at the output. Unfortunately, superimposed on the signal of interest is the image $f_0-f_1$. The "image problem" of simple direct conversion receivers is well known in the art of receiver design, the solution to which has been the subject of scholarly study for decades.

Image reject mixers, such as mixer 20 in FIG. 2, have been developed in response to the image problem suffered by simple direct conversion receivers. The operation of image reject mixers, including the mathematical basis upon which they operate, is described in detail in "High-Performance, Single-Signal Direct-Conversion Receivers" by Rick Campbell, published in the January, 1993 issue of QST magazine. Image reject mixers utilize two local oscillator signals, each differing from the other by 90 degrees in phase. Image reject mixers also require the use of two separate mixer elements. Image reject receivers represent a complex and expensive solution to the image problem of direct conversion receivers.

Both simple direct conversion receivers and image reject mixers nominally exhibit a loss of 6 dB because half of the signal is converted to $f_0+f_1$, the sum of the RF frequency and the local oscillator frequency, and then discarded. In practice, the loss is often greater than 6 dB because conventional mixers are typically implemented with diodes which exhibits a finite amount of loss themselves. Typical conversion loss in prior art image reject mixers is 7–8 dB.

What is needed is a low-loss method and apparatus for simply and inexpensively overcoming the image problem of direct conversion receivers.

DETAILED DESCRIPTION OF THE DRAWINGS

The method and apparatus of the present invention represent a simple and inexpensive product detector which facilitates the conversion of a signal to baseband without the unwanted image from interfering. A commutating switch is used in combination with capacitors to integrate portions of the input signal. The in-phase and quadrature signals that result represent the signal of interest at baseband.

Figure 3:
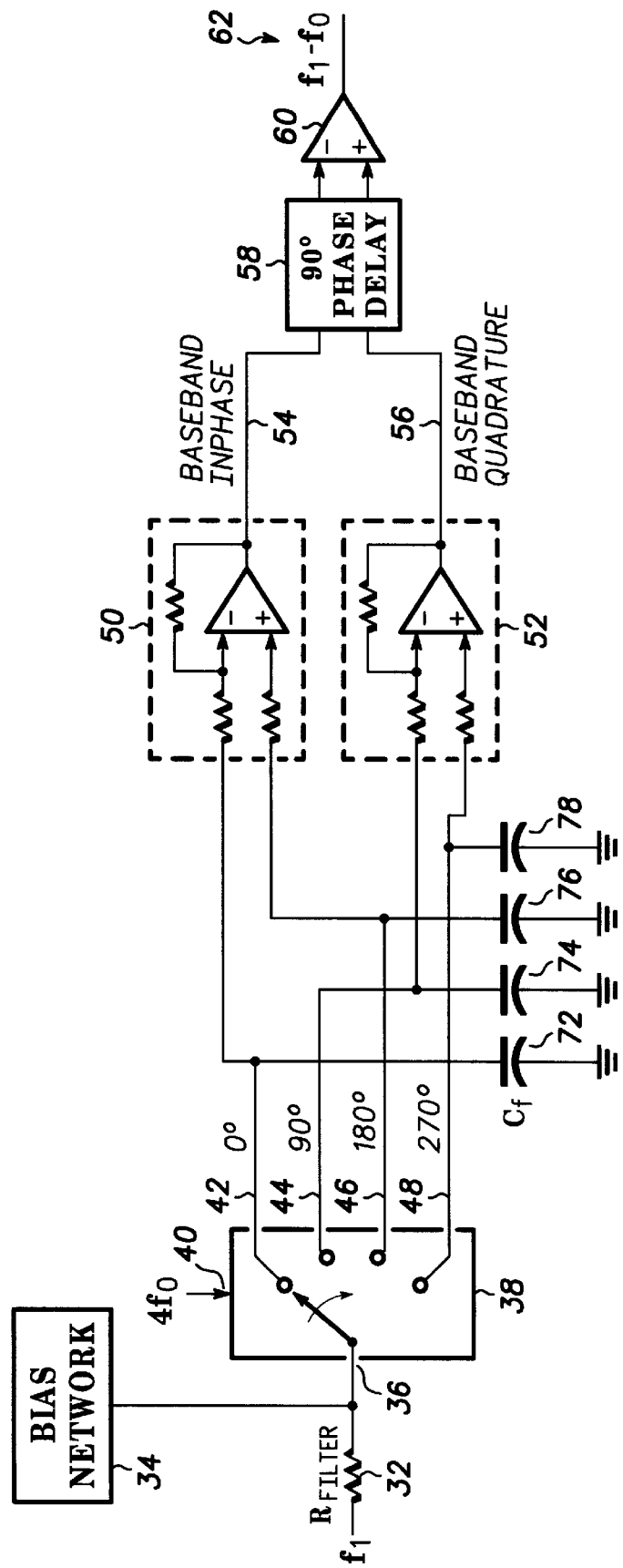
FIG. 3 shows a direct conversion receiver in accordance with a preferred embodiment of the present invention.

Turning now to the drawings in which like reference characters indicate corresponding elements throughout the several views, attention is first directed to FIG. 3. FIG. 3 shows a direct conversion receiver in accordance with a preferred embodiment of the present invention. Direct conversion receiver 30 includes resistor 32, bias network 34, commutating switch 38, capacitors 72, 74, 76, and 78, summing amplifiers 50 and 52, phase delay 58, and summing amplifier 60.

In operation, an RF or IF signal $f_1$ is received at resistor 32. Resistor 32, as is more fully discussed below, forms a filter when taken in combination with capacitors 72–78. After passing through resistor 32, the input signal is received by commutating switch 38 at input 36. Commutating switch 38 switches input 36 to outputs 42, 44, 46, and 48. The rate at which commutating switch 38 operates is controlled by a signal present at control input 40. In the preferred embodiment as shown in FIG. 3, the control signal input to control input 40 is substantially equal to four times the local oscillator frequency that would exist in a simple direct conversion receiver. As a result, input 36 is switched to each of the four outputs substantially once during each period of the input signal $f_1$.

In a preferred embodiment, commutating switch 38 remains closed at each of the four outputs for substantially 90 degrees at the frequency of the input signal. In alternate embodiments, commutating switch 38 remains closed at each of the four outputs for less than 90 degrees.

During the time that commutating switch 38 connects input 36 to output 42, charge builds up on capacitor 72. Likewise, during the time commutating switch 38 connects input 36 to output 44, charge builds up on capacitor 74. The same principle holds true for capacitors 76 and 78 when commutating switch 38 connects input 36 to outputs 46 and 48 respectively. As commutating switch 38 cycles through the four outputs, capacitors 72–78 charge to voltage values substantially equal to the average value of the input signal during their respective quadrants. Each of the capacitors functions as a separate integrator, each integrating a separate quarter wave of the input signal. This principle is described more fully with respect to FIG. 4 below.

Output 42 represents the average value of the input signal during the first quarter wave of the period, and is termed the 0 degree output. Output 44 represents the average value of the input signal during the second quarter wave of the period, and is termed the 90 degree output. Output 46 represents the average value of the input signal during the third quarter wave of the period, and is termed the 180 degree output. Output 48 represents the average value of the input signal during the fourth quarter wave of the period, and is termed the 270 degree output.

The outputs of commutating switch 38 are input to summing amplifiers 50 and 52. Summing amplifier 50 differentially sums the 0 degree output and the 180 degree output, thereby producing baseband in-phase signal 54. Summing amplifier 52 differentially sums the 90 degree output and the 270 degree output, thereby producing baseband quadrature signal 56. Baseband in-phase signal 54 and baseband quadrature signal 56 are input to phase delay 58 which shifts the phase of baseband quadrature signal 56 by 90 degrees relative to baseband in-phase signal 54. The resulting signals are then summed by summing amplifier 60 to produce the signal of interest 62.

The combination of resistor 32, commutating switch 38, and capacitors 72–78 form a portion of a preferred embodiment of a product detector. This product detector is referred to herein as a "Tayloe Product Detector." The Tayloe Product Detector has many advantages. One advantage is low conversion loss. The Tayloe Product Detector can exhibit less than 1 dB of conversion loss, which is 6–7 dB improvement over the typical conversion loss of 7–8 dB in the prior art. This 6–7 dB conversion loss improvement translates into a 6–7 dB improvement in overall receiver noise figure. The noise figure improvement results in substantial receiver performance gains, in part because a pre-amplifier may become unnecessary as a result. The use of a pre-amplifier, while improving receiver noise figure by overcoming front end receiver loss, causes large signal performance to suffer due to an amplified high-level input signal overloading the input mixer. Because the Tayloe Product Detector significantly reduces front end loss, the pre-amplifier and its associated problems may become unnecessary in future direct conversion receiver designs.

Another advantage of the Tayloe Product Detector is its narrowband detection characteristic. Resistor 32 and each of capacitors 72–78 form lowpass filters. The commutating effect of the four capacitors turns the lowpass response into a bandpass response centered on $f_1$. The width of the bandpass is easily set by proper selection of resistor 32 and capacitors 72–78.

Prior art high-performance receivers often use a highly selective bandpass filter in front of the mixer. The width of the filter is set to cover the entire range over which the receiver can be tuned. The more selective the filter, the higher the insertion loss, which in turn decreases the sensitivity of the receiver. In contrast, the narrowband characteristic of the Tayloe Product Detector is such that it is naturally centered on the frequency to which the detector is set. Substantial rejection is achieved outside the detection bandwidth, and as a result, front end filtering requirements along with the associated insertion loss are reduced, resulting in higher sensitivity.

Figure 1:
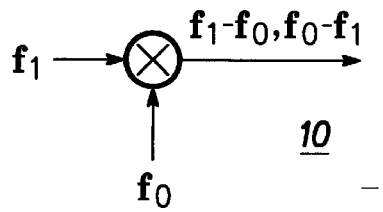
FIG. 1 shows a prior art direct conversion receiver.
Figure 2:
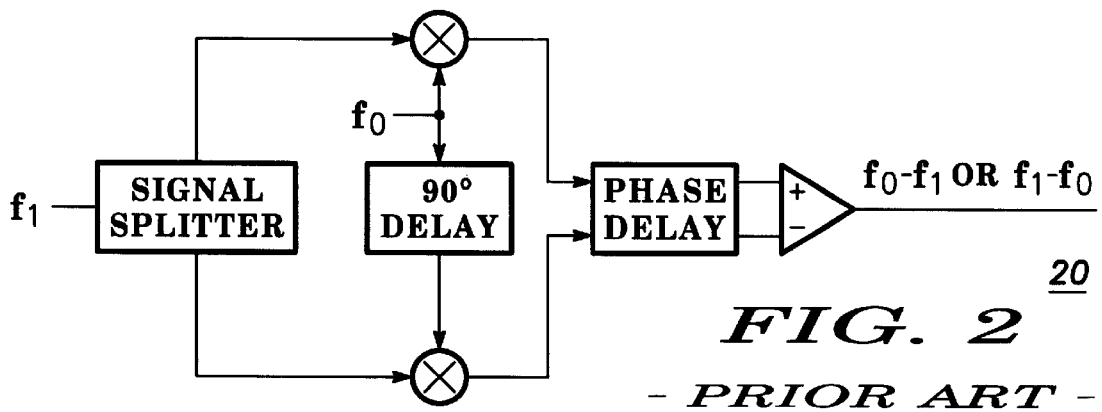
FIG. 2 shows a prior art image reject mixer.
Figure 4:
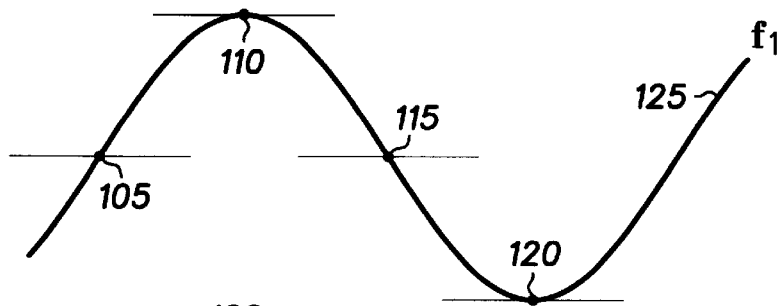
FIG. 4 shows a waveform in accordance with a preferred embodiment of the present invention.

FIG. 4 shows a waveform in accordance with a preferred embodiment of the present invention. Waveform 100 includes signal 125 which corresponds to the input signal $f_1$. Superimposed on signal 125 are points 105, 110, 115, and 120. Point 105 represents the voltage to which capacitor 72 (FIG. 3) charges. Likewise, point 110 represents the voltage to which capacitor 74 charges, point 115 represents the voltage to which capacitor 76 charges, and point 120 represents the voltage to which capacitor 78 charges. One skilled in the art will understand that if $f_1$ is a carrier signal with no information signal superimposed, and the carrier signal frequency is exactly equal to $f_0$, four evenly spaced samples of $f_1$ will continuously be taken by the action of the Tayloe Product Detector, and the voltages represented by points 105, 110, 115, and 120 will be stationary. Stationary voltages on the integrating capacitors 72–78 represent no signal of interest at baseband.

The operation just described is the case where $f_1$ is a pure carrier and the local oscillator is tuned to bring the carrier to zero Hz so that no signal is present at baseband. The tuning operation of the Tayloe Product Detector can be best understood by way of example where the tuning is not as in the previous example, but rather is slightly off. By way of example, assume that the Tayloe Product Detector of FIG. 3 has input signal $f_1$ and control signal $4f_0$ where $f_0$ differs in frequency by $\Delta f$, that is, $f_1 - f_0 = \Delta f$. Referring now to FIG. 4, points 105, 110, 115, and 120 will not be stationary, but instead will move along the contour of $f_1$, because $f_1$ does not exactly equal $4f_0$. Points 105, 110, 115, and 120, which represent the integrated voltages on capacitors 72–78, will change at a rate equal to $\Delta f$, which is the frequency of the signal of interest at baseband. One skilled in the art will understand that when information bearing signals are superimposed on $f_1$, the Tayloe Product Detector translates those information bearing signals to baseband in the same manner that $\Delta f$ is converted to baseband in the previous example.

Figure 5:
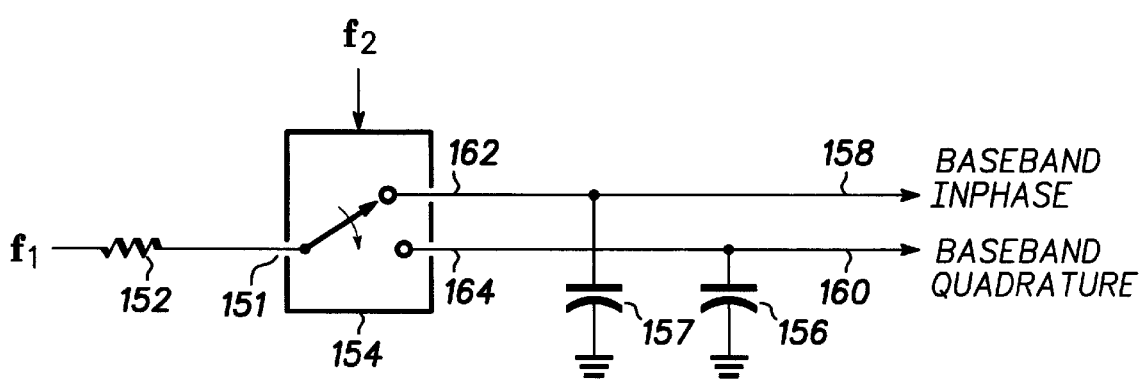
FIG. 5 shows a product detector in accordance with a preferred embodiment of the present invention.

FIG. 5 shows a product detector in accordance with a preferred embodiment of the present invention. Product detector 150 includes resistor 152, commutating switch 154, and capacitors 156 and 157. Commutating switch 154 is controlled by a signal present at control input 153. Product detector 150 differs from the product detector embodied in FIG. 3 in that only two outputs exist. Commutating switch 154 samples the input signal $f_1$ at two points rather than at four points as in FIG. 3. Commutating switch 154 creates the baseband in-phase signal 158 by connecting input 151 to output 162 once for each period of the input signal $f_1$. Commutating switch 184 also creates the baseband quadrature signal 160 by connecting input 151 to output 164 once for each period of the input signal f1. Input 151 is connected to outputs 162 and 164 at points in time which represent substantially 90 degrees at the frequency of the input signal $f_1$. Commutating switch 154 preferably remains closed for substantially 90 degrees of the input signal $f_1$ for each of outputs 162 and 164.

In operation, under control of control signal $f_2$ at input 153, commutating switch 154 operates as follows: input 151 is connected to output 162 for substantially 90 degrees at the frequency of the input signal $f_1$ thereby allowing capacitor 157 to charge to the average value of the input signal during the period which commutating switch 154 was closed on output 162. Then, input 151 is connected to output 164 for substantially 90 degrees at the frequency of the input signal $f_1$ thereby allowing capacitor 156 to charge to the average value of the input signal during the period which commutating switch 154 was closed on output 164. As a result of the operation of product detector 150, baseband in-phase signal 158 and baseband quadrature signal 160 represent integrated samples of the input waveform where the samples have been taken substantially 90 degrees apart. Product detector 150 can be substituted into direct conversion receiver 30 (FIG. 3) to reduce the parts count at the expense of some gain.

Figure 6:
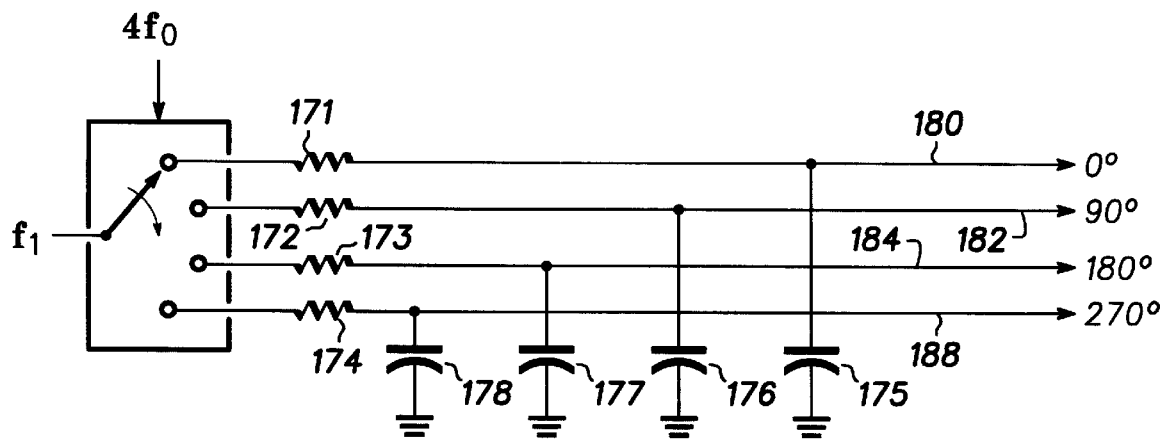
FIG. 6 shows a product detector in accordance with an alternate embodiment of the present invention.

FIG. 6 shows a product detector in accordance with an alternate embodiment of the present invention. Product detector 170 shows an alternate embodiment in which each integrating capacitor has its own resistor. For example, 0 degree output 180 has a voltage controlled by the combination of capacitor 175 and resistor 171. Likewise, 90 degree output 182 has a voltage controlled by the combination of capacitor 176 and resistor 172, 180 degree output 184 has a voltage controlled by the combination of capacitor 177 and resistor 173, and 270 degree output 188 has a voltage controlled by the combination of capacitor 178 and resistor 174. Resistor 171 and capacitor 175 form a first integrator. The commutating switch of product detector 170 connects the input to this first integrator for substantially 90 degrees of the input signal. One skilled in the art will readily understand that the remaining resistor/capacitor pairs also form integrators, each of which preferably integrates for substantially 90 degrees of the input signal. In one embodiment, all resistor/capacitor pairs have the same values, and in alternate embodiments, the resistor capacitor pairs have different values. In these alternate embodiments the separate integrators can have different time constants.

Figure 7:
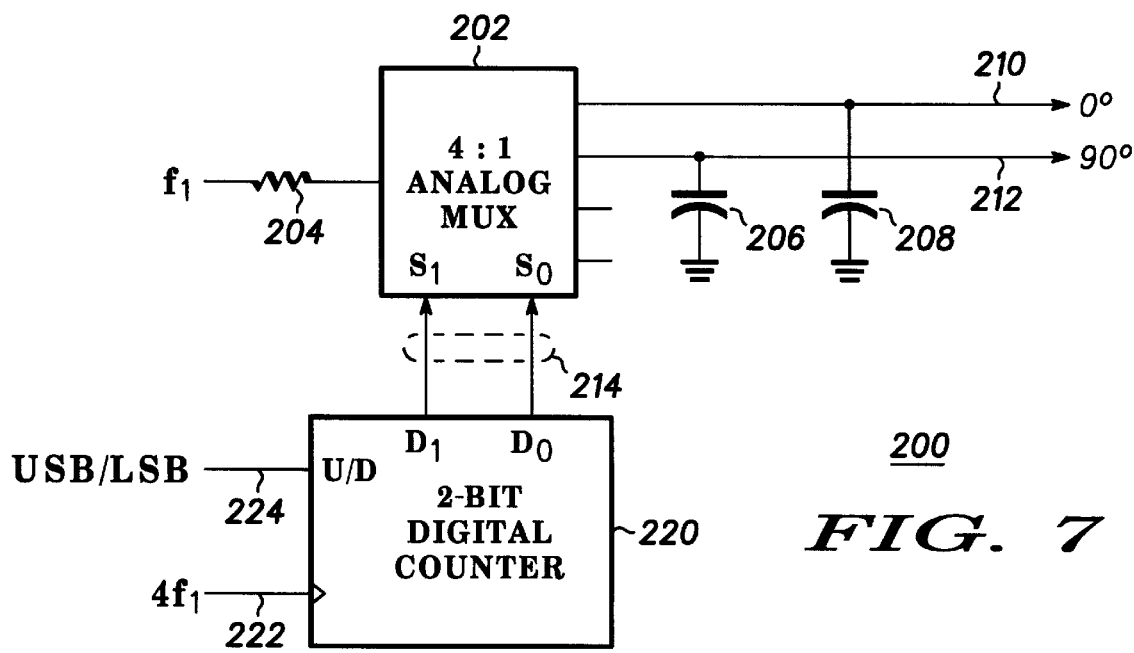
FIG. 7 shows a product detector in accordance with an alternate embodiment of the present invention.

FIG. 7 shows a product detector in accordance with an alternate embodiment of the present invention. Product detector 200 includes analog multiplexer 202 and digital counter 220. Input signal $f_1$ is received at resistor 204 and is then input to analog multiplexer 202. Analog multiplexer 202 is controlled by control signals 214 which are generated by digital counter 220. Digital counter 220 runs at a clock frequency of substantially $4f_1$. One skilled in the art of analog and digital circuit design will readily understand that input signal $f_1$ is connected to each of the four outputs of analog multiplexer 202 for substantially 90 degrees of the input signal. As embodied in FIG. 7, 0 degree output 210 and 90 degree output 212 are used to generate baseband in-phase and quadrature signals. Of course, the remaining two outputs (180 degrees and 270 degrees) can be utilized as embodied in FIG. 3 to achieve greater gain.

Digital counter 220 includes up/down control 224. When digital counter 220 counts up, output 210 is the 0 degree output and output 212 is the 90 degree output. When digital counter 220 counts down, the opposite is true. When counting down, output 210 represents the 90 degree output and output 212 represents the 0 degree output. The Tayloe Product Detector, therefore, provides for a simple and efficient mechanism to switch from the image above the carrier to the image below the carrier. One well-known common used for switching between images is for switching between upper side band (USB) and lower side band (LSB) when listening to single side band (SSB) transmissions.

EXPERIMENTAL RESULTS

A direct conversion receiver which utilizes a Tayloe Product Detector has been built. The receiver design is the same as direct conversion receiver 30 (FIG. 3) utilizing an analog multiplexer and a digital counter as shown in FIG. 7. The analog multiplexer is a Texas Instruments SN74BCT3253D. The digital counter is an industry standard 74ACT163. The analog multiplexer is a 5 volt part which has an effective input range of substantially zero to four volts. Bias network 34 biases the input of the analog multiplexer to substantially 2 volts. This represents the ability to handle input signals of up to substantially +19 dBm. This is advantageous in part because typical maximum signal ranges for prior art diode mixers is substantially +7 dBm. A further advantage is that analog multiplexers capable of operating at higher voltages can be readily obtained or easily designed, thereby increasing the dynamic range further.

The prototyped direct conversion receiver has an input bandwidth of roughly 1 kHz centered at 7 MHz. This was accomplished with resistor 32 at 50 ohms, and each of capacitors 72–78 at 0.3 microfarads. The clock input to the SN74ACT163 digital counter is nominally 28 MHz, and the receiver is tuned by varying this clock frequency. It is possible to build receivers at much higher frequencies, the only limitation being the rate at which the signal can be commutated through the integrators, which at the time of this writing is many orders of magnitude greater than the prototyped unit. The scope of the present invention is intended to include receivers at these higher frequencies.

In summary, the method and apparatus of the present invention provides an advantageous means for generating baseband in-phase and quadrature signals from an RF or IF signal. While we have shown and described specific embodiments of the present invention, further modifications and improvements will occur to those skilled in the art. For example, the method and apparatus of the present invention have been described primarily in the context of direct conversion receivers; however, the Tayloe Product Detector is applicable anywhere signals need to be converted to baseband, such as in the last stage of a superheterodyne receiver. We desire it to be understood, therefore, that this invention is not limited to the particular forms shown and we intend in the appended claims to cover all modifications that do not depart from the spirit and scope of this invention.

What is claimed is:

1. A product detector for detecting a signal of interest at an input frequency, and producing baseband in-phase and quadrature signals which represent the signal of interest, said product detector comprising:

an input port;

an in-phase output port;

a quadrature output port;

a commutating switch having an input coupled to the input port of the product detector, and having a zero degree output coupled to the in-phase output port, a 90 degree output coupled to the quadrature output port, a 180 degree output, and a 270 degree output, wherein the commutating switch couples the input to each of the four outputs in a periodic fashion at a rate of substantially four times the input frequency, thereby coupling the input to each of the four outputs substantially once during each period of the input frequency;

a first charge storage device coupled between the zero degree output and a reference potential;

a second charge storage device coupled between the 90 degree output and the reference potential;

a third charge storage device coupled between the 180 degree output and the reference potential; and a fourth charge storage device coupled between the 270° degree output and the reference potential.

2. The product detector of claim 1 further comprising a resistor coupled between the input port of the product detector and the input of the commutating switch.

3. The product detector of claim 1 further comprising:

a first differential summer responsive to the zero degree output and the 180 degree output, said first differential summer having an output coupled to the inphase output port; and a second differential summer responsive to the 90 degree output and the 270 degree output, said second differential summer having an output coupled to the quadrature output port.

4. The product detector of claim 1 further comprising:

a first resistor coupled between the zero degree output and the first charge storage device;

a second resistor coupled between the 90 degree output and the second charge storage device;

a third resistor coupled between the 180 degree output and the third charge storage device; and a fourth resistor coupled between the 270 degree output and the fourth charge storage device, wherein the inphase output port is coupled to a point between the first resistor and the first charge storage device, and the quadrature output port is coupled to a point between the second resistor and the second charge storage device.

5. The product detector of claim 1 wherein the commutating switch includes a control input responsive to which the switch commutates.

6. The product detector of claim 5 further comprising a controller having an output coupled to the control input of the commutating switch.

7. The product detector of claim 6 wherein the controller comprises a digital counter.

8. The product detector of claim 1 wherein the commutating switch comprises an analog multiplexor.

9. The product detector of claim 8 further comprising a bias circuit on the input to the commutating switch.

10. An apparatus for generating baseband inphase and quadrature signals from an input signal having a carrier frequency, said apparatus comprising:
   a first integrator having an input periodically coupled to the input signal for a first time portion of the input signal;
   a second integrator having an input periodically coupled to the input signal for a second time portion of the input signal, wherein the first time portion of the input signal and the second time portion of the input signal are separated by substantially 90 degrees at the carrier frequency;
   a third integrator having an input periodically coupled to the input signal for a third time portion of the input signal; and
   a fourth integrator having an input periodically coupled to the input signal for a fourth time portion of the input signal, wherein the third time portion of the input signal and the second time portion of the input signal are separated by substantially 90 degrees at the carrier frequency, and wherein the fourth time portion of the input signal and the third time portion of the input signal are separated by substantially 90 degrees at the carrier frequency.

11. The apparatus of claim 10 wherein the first time portion of the input signal is substantially equal to 90 degrees at the carrier frequency, and the second time portion of the input signal is substantially equal to 90 degrees at the carrier frequency.

12. The apparatus of claim 10 wherein the first time portion of the input signal is equal to less than 90 degrees at the carrier frequency and the second time portion of the input signal is equal to less than 90 degrees at the carrier frequency.

13. The apparatus of claim 10 wherein the first integrator further includes an output for producing the baseband inphase signal, and the second integrator further includes an output for producing the baseband quadrature signal.

14. The apparatus of claim 10 wherein the first time portion of the input signal is substantially equal to 90 degrees at the carrier frequency, the second time portion of the input signal is substantially equal to 90 degrees at the carrier frequency, the third time portion of the input signal is substantially equal to 90 degrees at the carrier frequency, and the forth time portion of the input signal is substantially equal to 90 degrees at the carrier frequency.

* * * * *